(12) United States Patent
Park et al.

(10) Patent No.: US 12,519,064 B2
(45) Date of Patent: Jan. 6, 2026

(54) DISPLAY DEVICE

(71) Applicant: Samsung Display Co., LTD., Yongin-si (KR)

(72) Inventors: Youngjin Park, Yongin-si (KR); Jooyoung Kim, Yongin-si (KR); Young-Joo Nam, Yongin-si (KR); Hyun Seop Song, Yongin-si (KR); Byungchul Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 442 days.

(21) Appl. No.: 18/097,128

(22) Filed: Jan. 13, 2023

(65) Prior Publication Data

US 2023/0343722 A1 Oct. 26, 2023

(30) Foreign Application Priority Data

Apr. 22, 2022 (KR) ........................ 10-2022-0050381

(51) Int. Cl.
| | |
|---|---|
| *H01L 23/552* | (2006.01) |
| *G02F 1/1333* | (2006.01) |
| *H01L 23/498* | (2006.01) |
| *H01L 25/16* | (2023.01) |
| *H05K 1/18* | (2006.01) |
| *H05K 9/00* | (2006.01) |
| *H10K 77/10* | (2023.01) |

(52) U.S. Cl.
CPC ...... *H01L 23/552* (2013.01); *G02F 1/133334* (2021.01); *H05K 9/00* (2013.01); *H10K 77/111* (2023.02); *H01L 23/4985* (2013.01); *H01L 25/167* (2013.01); *H05K 1/189* (2013.01); *H05K 2201/056* (2013.01); *H05K 2201/10128* (2013.01); *H05K 2201/10136* (2013.01)

(58) Field of Classification Search
CPC .... H10K 59/8722; H10H 20/85; H10H 20/89; H10H 29/85; H10H 29/89; G02F 1/33334; G02F 1/133305; G02F 2201/50
See application file for complete search history.

(56) References Cited

U.S. PATENT DOCUMENTS

2023/0010653 A1* 1/2023 Schwager ......... G02F 1/133325

FOREIGN PATENT DOCUMENTS

| KR | 20-0397003 | | 9/2005 | | |
|---|---|---|---|---|---|
| KR | 10-2008-0001327 A | | 1/2008 | | |
| KR | 10-1071138 | | 10/2011 | | |
| KR | 20170043810 A | * | 4/2017 | ........... | G02F 1/1333 |
| KR | 20180058074 A | * | 5/2018 | ....... | G02F 1/133308 |
| KR | 20180068357 A | * | 6/2018 | ........... | G02F 1/1345 |
| KR | 10-2021-0080945 A | | 7/2021 | | |
| KR | 20210086313 A | * | 7/2021 | ....... | G02F 1/133334 |

* cited by examiner

*Primary Examiner* — David A Zarneke
(74) *Attorney, Agent, or Firm* — Womble Bond Dickinson (US) LLP

(57) ABSTRACT

A display device includes: a display panel; a driving integrated circuit chip configured to drive the display panel; a first printed circuit board connected to the display panel; a second printed circuit board connected to the first printed circuit board; and a cover including a body portion covering the driving integrated circuit chip, the first printed circuit board, and the second printed circuit board, and a wing portion protruding from the body portion, wherein the wing portion extends from a front surface of the display panel to a rear surface of the display panel while surrounding a side surface of the display panel.

18 Claims, 14 Drawing Sheets

DISPLAY DEVICE

CROSS-REFERENCE TO RELATED APPLICATION

The present application claims priority to and the benefit of Korean Patent Application No. 10-2022-0050381, filed in the Korean Intellectual Property Office on Apr. 22, 2022, the entire content of which is incorporated herein by reference.

BACKGROUND

1. Field

Aspects of some embodiments relate to a display device.

2. Description of the Related Art

A display device for displaying images may be utilized in various electronic devices, for example, mobile devices such as smartphones and tablets, monitors, and televisions. As a display device, a liquid crystal display, an emissive display device, and the like are used.

The liquid crystal display may display images by controlling transmittance of light irradiated by a backlight by applying an electric field to regions of a liquid crystal layer corresponding to pixels. The emissive display device may display images by controlling the luminance of the light emitting diodes corresponding to pixels. Because the emissive display devices generally do not require a light source such as a backlight, thickness and weight may be relatively reduced compared to alternative display devices. In addition, the emissive display device has characteristics such as relatively high luminance, a relatively high contrast ratio, relatively high color reproduction, a relatively high response speed, and the like, to display relatively high quality images.

The above information disclosed in this Background section is only for enhancement of understanding of the background and therefore the information discussed in this Background section does not necessarily constitute prior art.

SUMMARY

Aspects of some embodiments relate to a display device, and for example, to a display device including a cover capable of protecting a driving device from electromagnetic interference (EMI) and electrostatic discharge (ESD).

According to some embodiments, a display device includes circuit elements such as a driving device, and when the circuit elements are exposed to EMI or ESD, they may malfunction or be damaged. Aspects of some embodiments include a display device that can be protected from EMI and ESD.

Aspects of some embodiments include a display device including: a display panel; a driving integrated circuit chip configured to drive the display panel; a first printed circuit board connected to the display panel; a second printed circuit board connected to the first printed circuit board; and a cover including a body portion covering the driving integrated circuit chip, the first printed circuit board, and the second printed circuit board, and a wing portion protruding from the body portion. The wing portion may extend from a front surface of the display panel to a rear surface of the display panel while surrounding a side surface of the display panel.

According to some embodiments, the body portion may cover the driving integrated circuit chip on a front surface of the display panel and cover the second printed circuit board on a rear surface of the display panel, and According to some embodiments, the wing portion may be attached to the body portion on the rear surface.

According to some embodiments, the body portion and the wing portion may each have a length in a first direction and a width in a second direction intersecting the first direction, and the length and the width of the wing portion may be smaller than the length and the width of the body portion, respectively.

According to some embodiments, the cover may be in the form of a tape including a metal layer.

According to some embodiments, the wing portion may include a first wing portion at a first end of the body portion and a second wing portion at a second end of the body portion, and the first wing portion and the second wing portion may be on a same line as the driving integrated circuit chip in a first direction.

According to some embodiments, the driving integrated circuit chip may be on a front surface of the display panel, the second printed circuit board may be on a rear surface of the display panel, and the first printed circuit board may be bent while surrounding an edge of the display panel.

According to some embodiments, the body portion may cover the driving integrated circuit chip on the front surface of the display panel, may cover the second printed circuit board on the rear surface of the display panel, and may cover the first printed circuit board over the front surface, the side surface, and the rear surface of the display panel.

According to some embodiments, the cover may include cuts between the driving integrated circuit chip and an edge of the display panel on the front surface of the display panel.

According to some embodiments, the cover may include a cut overlapping the driving integrated circuit chip on the front surface of the display panel.

According to some embodiments, the cover may include a cut between the body portion and the wing portion.

Aspects of some embodiments include a display device including: a display panel; a driving integrated circuit chip on a front surface of the display panel; a first printed circuit board connected to the front surface of the display panel and bent while surrounding an edge of the display panel; a second printed circuit board connected to the first printed circuit board and on a rear surface of the display panel; and a cover covering the driving integrated circuit chip, the first printed circuit board, and the second printed circuit board. The cover may include a body portion and a wing portion protruding from the body portion and having a width that is narrower than that of the body portion, and the wing portion may be attached to the body portion on a rear surface of the display panel.

According to some embodiments, the first printed circuit board may surround an edge of the display panel that is parallel to a first direction, and the wing portion may surround an edge of the display panel that is parallel to a second direction intersecting the first direction.

According to some embodiments, the body portion and the wing portion may each have a length in a first direction and a width in a second direction intersecting the first direction, and the length and the width of the wing portion may be smaller than the length and the width of the body portion, respectively.

According to some embodiments, the body portion and the wing portion may be integrally formed.

According to some embodiments, the wing portion may include a first wing portion at a first end of the body portion and a second wing portion at a second end of the body portion, and the first wing portion and the second wing portion may be on a same line as the driving integrated circuit chip in a first direction.

According to some embodiments, the body portion may be bent while surrounding the edge of the display panel.

According to some embodiments, the body portion may cover the driving integrated circuit chip from the front surface of the display panel, may cover the second printed circuit board on the rear surface of the display panel, and may cover the first printed circuit board over the front surface, the side surface, and the rear surface of the display panel.

According to some embodiments, the cover may include cuts between the driving integrated circuit chip and an edge of the display panel on the front surface of the display panel.

According to some embodiments, the cover may include cuts overlapping the driving integrated circuit chip on the front surface of the display panel.

According to some embodiments, the cover may include a cut between the body portion and the wing portion.

According to some embodiments, circuit elements such as the driving integrated circuit chip of the display device may be protected from EMI and ESD. In particular, it may be possible to prevent or reduce lifting off of the cover that can protect the circuit elements from EMI and ESD.

DETAILED DESCRIPTION

Figure 1:
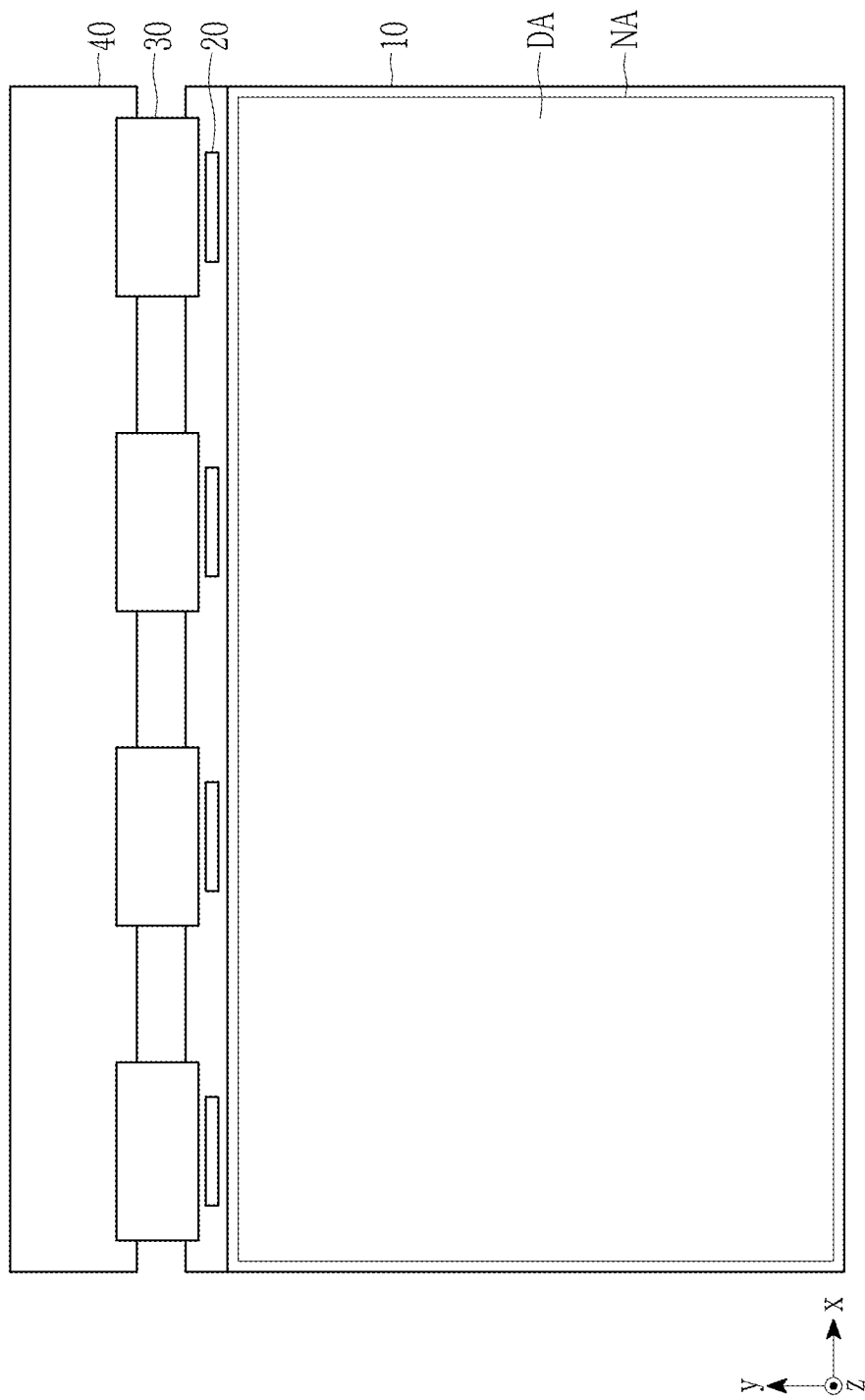
FIG. 1 and FIG. 2 each illustrate a schematic front view showing a display device according to some embodiments.

This disclosure will be described more fully hereinafter with reference to the accompanying drawings, in which embodiments are shown.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In addition, in the specification, "connected" means that two or more components are not only directly connected, but two or more components may be connected indirectly through other components, physically connected as well as being electrically connected, or it may be referred to be different names depending on the location or function, but may include connecting each of parts that are substantially integral to each other.

In the drawings, signs "x", "y", and "z" are used to indicate directions, wherein x is used for indicating a first direction, y is used for indicating a second direction that is perpendicular to the first direction, and z is used for indicating a third direction that is perpendicular to the first direction and the second direction.

Figure 2:
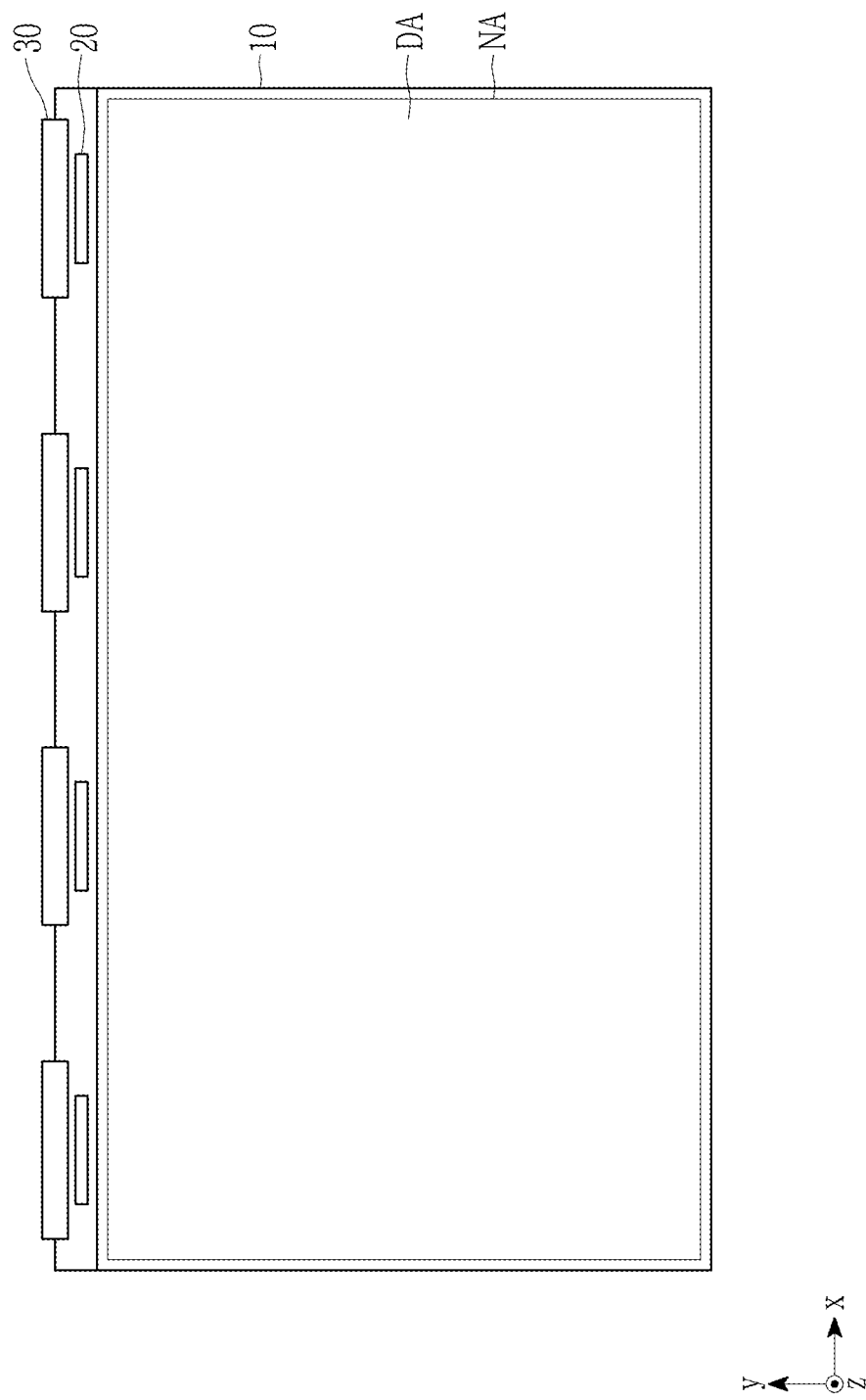
Figure 3:
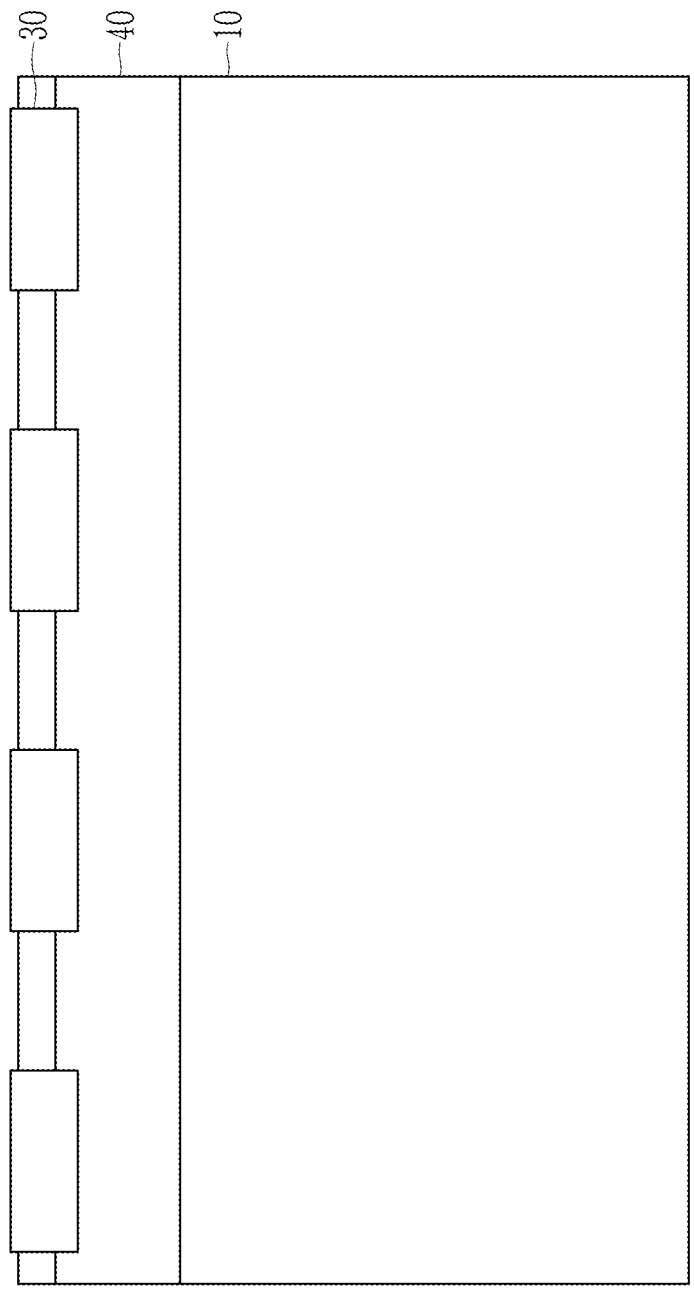
FIG. 3 illustrates a schematic rear view showing a display device according to some embodiments.

FIG. 1 and FIG. 2 each illustrate a schematic front view showing a display device according to some embodiments, and FIG. 3 illustrates a schematic rear view showing a display device according to some embodiments.

Referring to FIG. 1 and FIG. 2, the display device may include a display panel 10, a driving unit including a driving integrated circuit chip 20, a first printed circuit board 30, a printed circuit board 40, and the like. At least a portion of the first printed circuit board 30 may be flexible, or may be bendable. The first printed circuit board 30 may be referred to as a flexible printed circuit board or a printed circuit film. FIG. 1 shows a state before bending the first printed circuit board 30, and FIG. 2 and FIG. 3 illustrate a state after bending the first printed circuit board 30.

The display panel 10 may be a light emitting display panel including light emitting diodes or a liquid crystal display panel including a liquid crystal layer, but is not limited thereto. The display panel 10 may include a display area DA corresponding to a screen on which an image is displayed and a non-display area NA, and circuits and/or signal lines for generating and/or transferring various signals and voltages applied to the display area DA are located in the non-display area NA. The non-display area NDA may be positioned to surround a periphery of the display area DA. In FIG. 1, inside and outside of a dotted rectangle correspond to the display area DA and the non-display area NA, respectively.

Pixels are positioned to have a matrix form in the display area DA of the display panel 10. In addition, signal lines such as a gate line and a driving voltage line may be positioned in the display area DA. Each of the pixels may be connected to the gate line, the data line, the driving voltage line, and the like to receive a gate signal, a data voltage, a driving voltage, and the like from these signal lines. The pixel may be implemented as a light-emitting device such as a light emitting diode.

A touch electrode for detecting a contact touch and/or a non-contact touch of a user may be positioned in the display area DA. Accordingly, the display panel 10 may be a touch screen panel capable of sensing a touch in addition to having a function of displaying an image. Although the display area DA having a substantially rectangular shape is illustrated, the display area DA may have various shapes such as a polygonal shape, a circular shape, an elliptical shape, and the like.

A driving unit may be located in the non-display area NA of the display panel 10 to generate and/or process various signals for driving the display panel 10. The driving unit may include a data driver for applying a data voltage to the data line, a gate driver for applying a gate signal to the gate line, and a signal controller for controlling the data driver and the gate driver. The pixels may receive the data voltage at set or predetermined timing or intervals depending on the gate signal generated by the gate driver. The gate driver may be integrated in the display panel 10, and may be positioned on at least one side of the display area DA (e.g., left and right sides of the display area DA).

The data driver may be provided as the driving integrated circuit chip 20. The driving integrated circuit chip 20 may be mounted in the non-display area NA at a lower end portion of the display panel 10. The driving integrated circuit chip 20 may have a three-dimensional shape of an approximate cuboid shape and an approximate rectangular planar shape. The driving integrated circuit chip 20 may be mounted with a long side that is parallel to the first direction x. The data driver may be provided as one driving integrated circuit chip 20 or a plurality of driving integrated circuit chips 20 depending on a size of the display panel 10. The driving integrated circuit chips 20 may be mounted to be aligned in the first direction x, e.g., may be positioned on a same line in the first direction x. In the illustrated embodiments, four driving integrated circuit chips 20 are mounted in a row along the first direction x. The driving integrated circuit chip 20 may be positioned on the first printed circuit board 30.

The signal controller may be provided as an integrated circuit chip, mounted in the second printed circuit board 40, and electrically connected to the display panel 10 through the first printed circuit board 30. The signal controller may be integrated into the driving integrated circuit chip 20.

A pad portion in which pads for receiving signals from the outside of the display panel 10 are arranged may be positioned in the non-display area NA of the display panel 10. The pad portion may be positioned at a lower portion of the display panel 10. The driving integrated circuit chip 20 may be positioned between the display area DA and the pad portion in a second direction y. A first end of the first printed circuit board 30 may be bonded to the first pad portion. Pads of the first printed circuit board 30 may be electrically connected to the pads of the pad portion.

A signal controller, a power management integrated circuit (PMIC), etc. may be positioned in the second printed circuit board 40. The second end of the first printed circuit board 30 may be bonded to the second printed circuit board 40.

The first printed circuit board 30 may be bent while surrounding a lower edge of the display panel 10 that is substantially parallel to the first direction x in a state where a first end thereof is bonded to the pad portion. Accordingly, as illustrated in FIG. 2 and FIG. 3, the second printed circuit board 40 may be positioned on a rear surface of the display panel 10, a portion protruding from the display panel 10 may be minimized, and a size of the display device may be reduced. The second printed circuit board 40 may be attached to the rear surface of the display panel 10 through an adhesive member in order to maintain a state in which the first printed circuit board 30 is bent.

Figure 4:
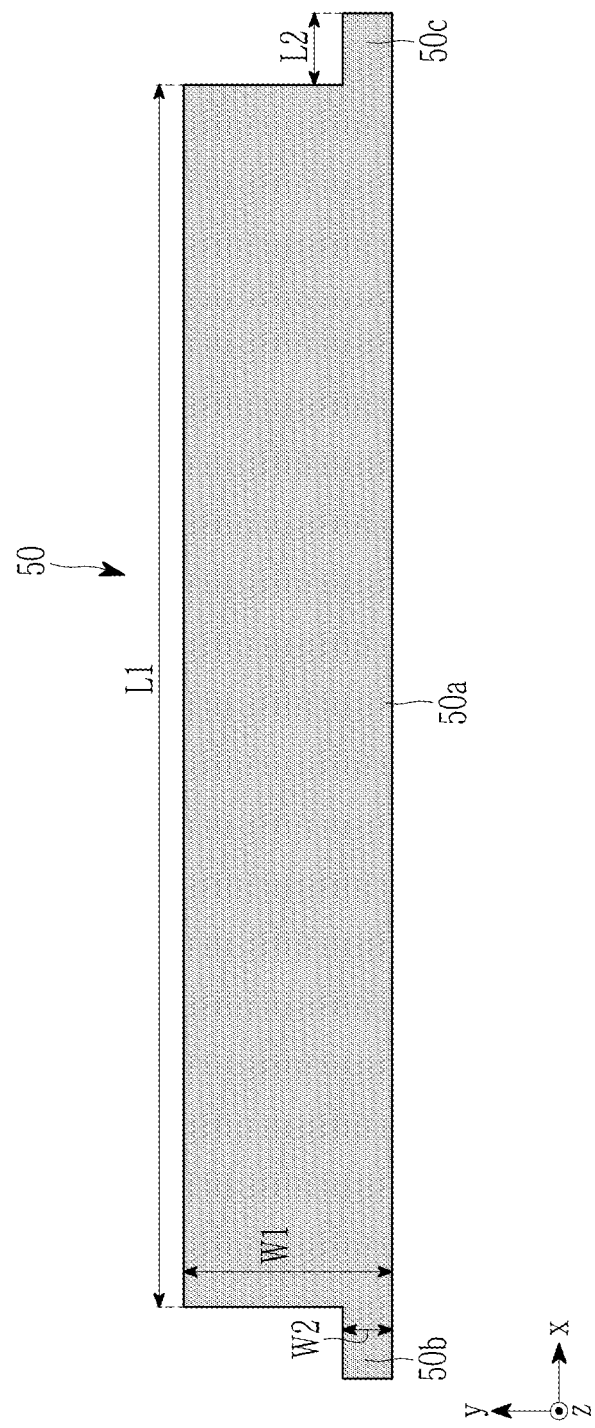
FIG. 4 illustrates a schematic view showing a cover according to some embodiments.
Figure 5:
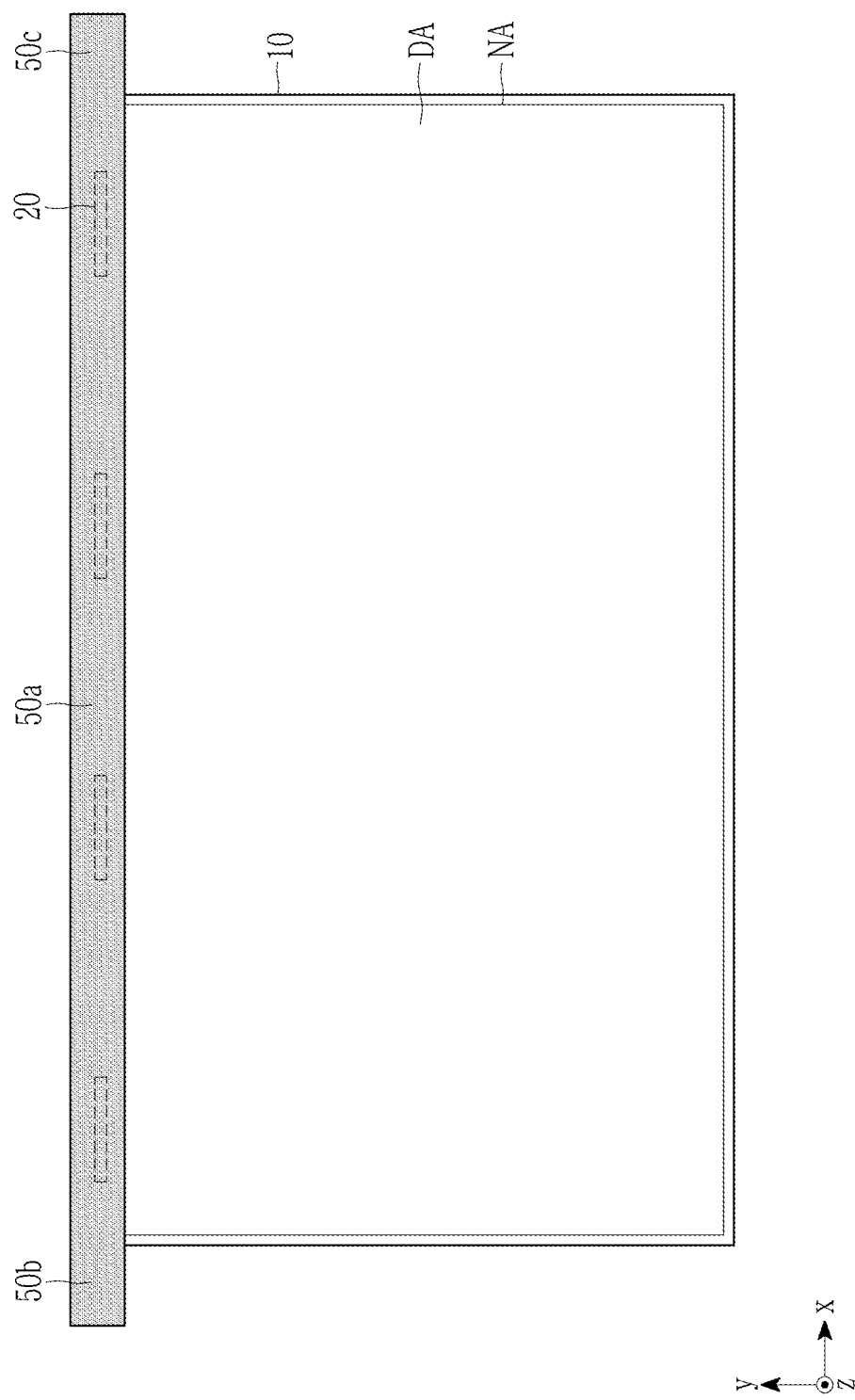
FIG. 5 illustrates a schematic front view showing a display device to which the cover illustrated in FIG. 4 is attached according to some embodiments.
Figure 6:
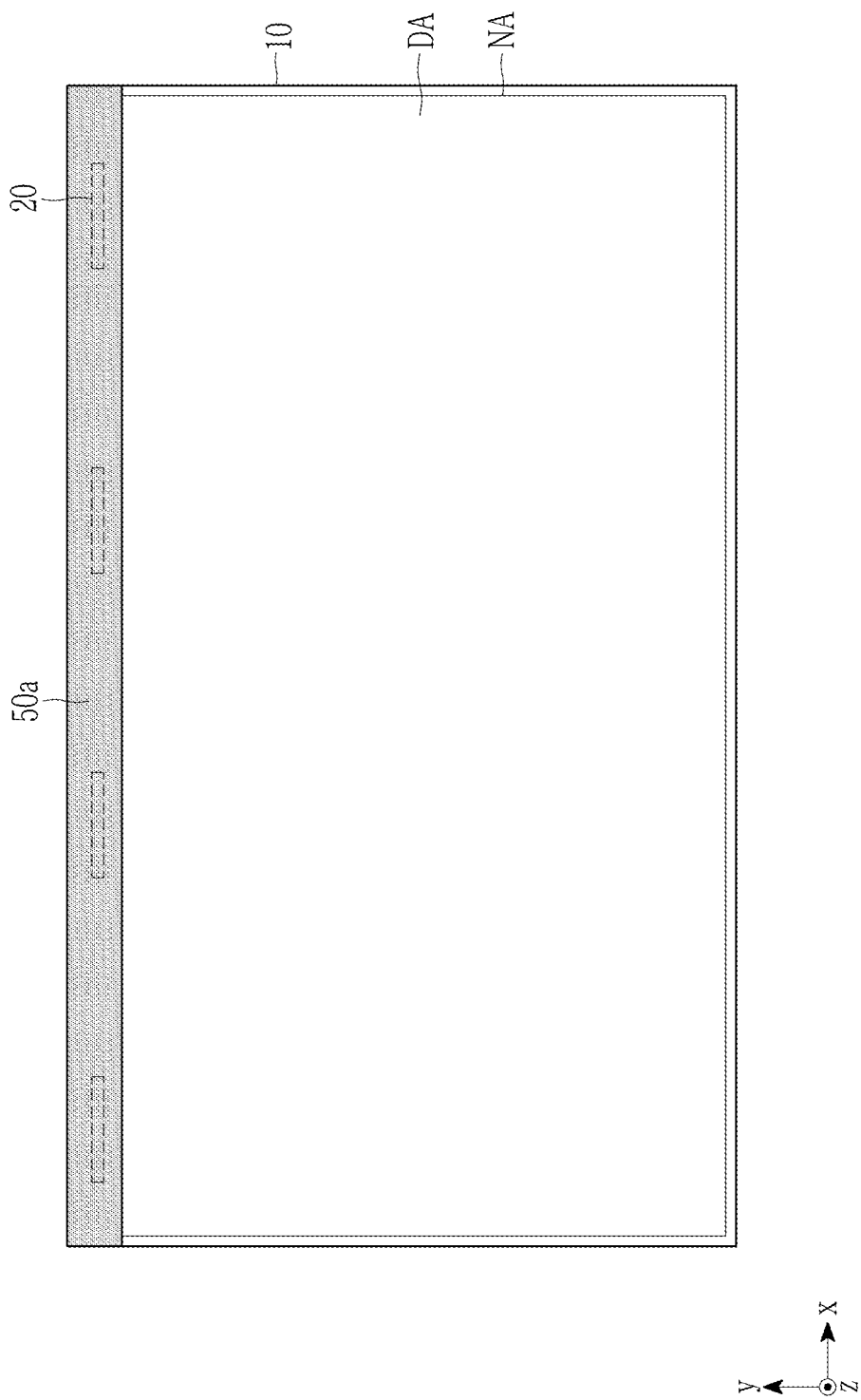
FIG. 6 illustrates a schematic front view showing a display device to which the cover illustrated in FIG. 4 is attached according to some embodiments.
Figure 7:
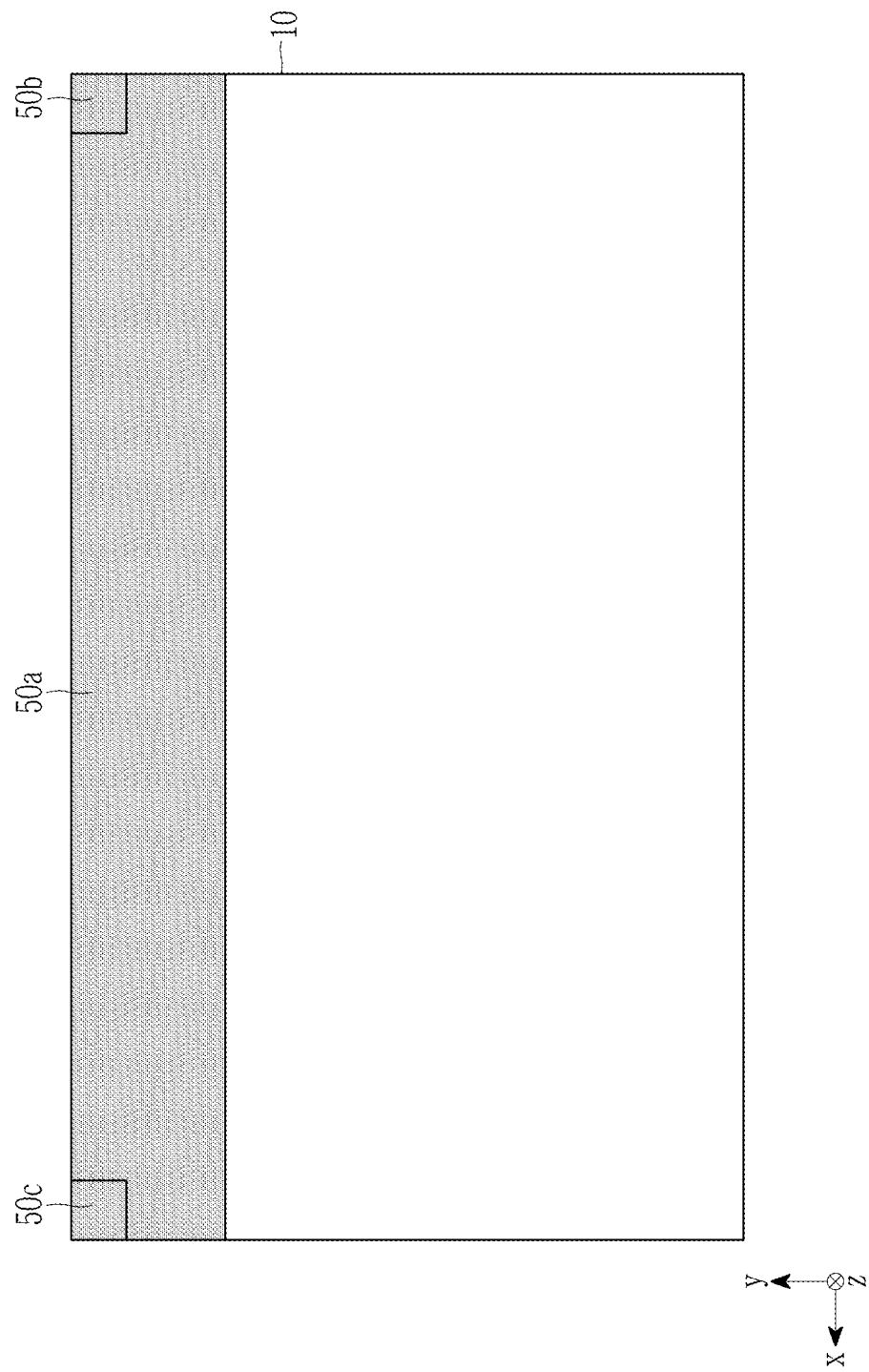
FIG. 7 illustrates a schematic rear view showing a display device to which the cover illustrated in FIG. 4 is attached according to some embodiments.
Figure 8:
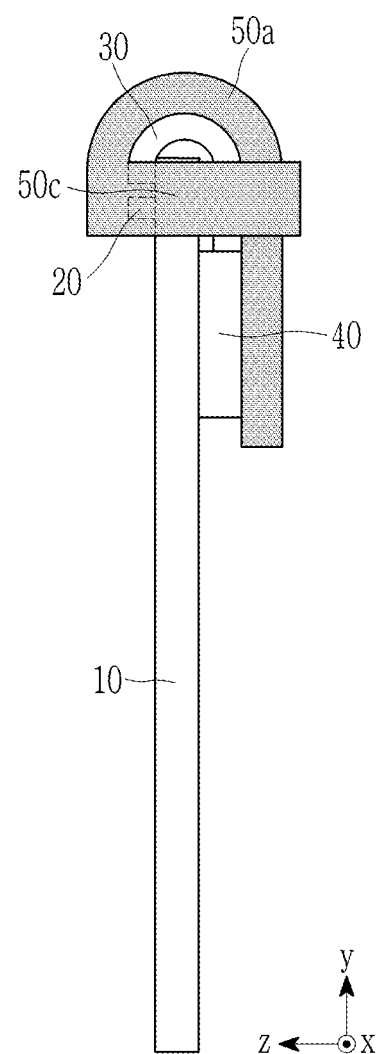
FIG. 8 illustrates a schematic side view showing a display device to which the cover illustrated in FIG. 4 is attached according to some embodiments.

FIG. 4 illustrates a schematic view showing a cover according to some embodiments, FIG. 5 illustrates a schematic front view showing a display device to which the cover illustrated in FIG. 4 is attached, FIG. 6 illustrates a schematic front view showing a display device to which the cover illustrated in FIG. 4 is attached, and FIG. 7 illustrates a schematic rear view showing a display device to which the cover illustrated in FIG. 4 is attached. FIG. 8 illustrates a schematic side view showing a display device to which the cover illustrated in FIG. 4 is attached.

Referring to FIG. 4, the cover 50 may be applied to cover the driving integrated circuit chip 20 positioned on the display panel 10 and circuit elements (e.g., signal controller, PMIC, etc.) positioned on the second printed circuit board 40, so as to protect them from EMI and ESD. In addition, the cover 50 may prevent the circuit elements from coming into direct contact with an external object, thereby protecting them from physical damage due to friction or the like. The cover 50 may be made of a flexible material capable of shielding EMI, ESD, and the like. For example, the cover 50 may be in the form of a tape including a metal layer. The metal layer of the cover 50 may include a metal foil, a metal fabric, a metal mesh, and the like. An adhesive member may be positioned on one surface of the cover 50. For example, an adhesive may be applied to one surface of the cover 50 or a double-sided adhesive tape may be attached thereto. The adhesive member may be entirely positioned on one surface of the cover 50.

The cover 50 may include a body portion 50a and wing portions 50b and 50c. The body portion 50a may have a substantially rectangular shape. The body portion 50a may have a length L1 in the first direction x and a width W1 in the second direction y. The length L1 of the body portion 50a may correspond to a length of the display panel 10 in the first direction x. The wing portions 50b and 50c may be positioned at opposite ends of the body portion 50a. The wing portions 50b and 50c may include a first wing portion 50b protruding from a second end of the body portion 50a and a second wing portion 50c protruding from a second end of the body portion 50a. A length L2 of the wing portions 50b and 50c in the first direction x may be smaller than the length L1 of the body portion 50a. The width W2 of the wing portions 50b and 50c in the second direction y may be smaller than the width W1 of the body portion 50a. The wing portions 50b and 50c may be integrally formed with the body portion 50a.

Referring to FIG. 4 to FIG. 8, the cover 50 may be applied to cover the driving integrated circuit chip 20, the first printed circuit board 30, and the second printed circuit board 40 in a state where the first printed circuit board 30 is bent and the second printed circuit board 40 is positioned on a rear surface of the display panel 10. The cover 50 may be attached to the non-display area NA of the display panel 10, the driving integrated circuit chip 20, the first printed circuit board 30, and the second printed circuit board 40. The body portion 50a may cover the driving integrated circuit chip 20 on a front surface of the display panel 10 (refer to FIG. 6), may cover the second printed circuit board 40 on a rear surface of the display panel 10 (refer to FIG. 7), and may cover the first printed circuit board 30 over front, side, and rear surfaces of the display panel 10 (refer to FIG. 8). Similar to the first printed circuit board 30, the body portion 50a may be bent while surrounding a lower edge of the display panel 10 that is substantially parallel to the first direction x. Because the non-display area NA is narrow on the front surface of the display panel 10, an attachment area of the cover 50 may be narrow on the front surface of the display panel 10. In addition, the driving integrated circuit chip 20 protrudes from a plane surface thereof of the display panel 10 by its thickness, and thus an air pocket may be generated between the cover 50 and the display panel 10. Accordingly, a defect in which the cover 50 is lifted off or the cover 50 is partially peeled off from the front surface of the display panel 10 may occur. As a result, the driving integrated circuit chip 20 is not completely covered by the cover 50, and thus the driving integrated circuit chip 20 may be vulnerable to electromagnetic waves or static electricity.

Referring to FIG. 5, in a state in which the body portion 50a is attached, the wing portions 50b and 50c may be positioned to protrude from the front surface of the display panel 10 to opposite sides of the body portion 50a. The wing portions 50b and 50c may be positioned to be aligned with the driving integrated circuit chip 20 in the first direction, and for example, may be positioned on a same line as that of the driving integrated circuit chip 20 in the first direction x. Then, when the wing portions 50b and 50c are folded toward a rear side, as illustrated in FIG. 6 to FIG. 8, the wing portions 50b and 50c may be bent while surrounding opposite edges of the display panel 10 that is substantially parallel to the second direction y, so that an upper portion thereof may be positioned on a rear surface of the display panel 10. The wing portions 50b and 50c may be attached to the body portion 50a on the rear surface of the display panel 10.

As such, the wing portions 50b and 50c may extend from opposite sides of the body portion 50a from the front surface of the display panel 10 to be attached to the main body portion 50a from the rear surface of the display panel 10, thereby increasing adhesion of the cover 50 and reducing and preventing the body portion 50a from lifting. In addition, it may be possible to reduce or prevent the body portion 50a from being lifted by a tensile force by the wing portions 50b and 50c on opposite sides of the body portion 50a. In addition, because it may not be necessary to increase an adhesive force of an adhesive member to prevent the cover 50 from lifting, a rework process for separating the attached cover 50 may be relatively easier if desired.

In the meantime, when the length L1 of the body portion 50a is shorter than a length in the first direction x of the display panel 10, at least a portion of the wing portions 50b and 50c may be attached to the rear surface of the display panel 10 or the second printed circuit board 40 instead of the body portion 50a. Even in this case, it is possible to prevent the body portion 50a from being lifted by an additional adhesive force and/or tensile force provided by the wing portions 50b and 50c.

Figure 9:
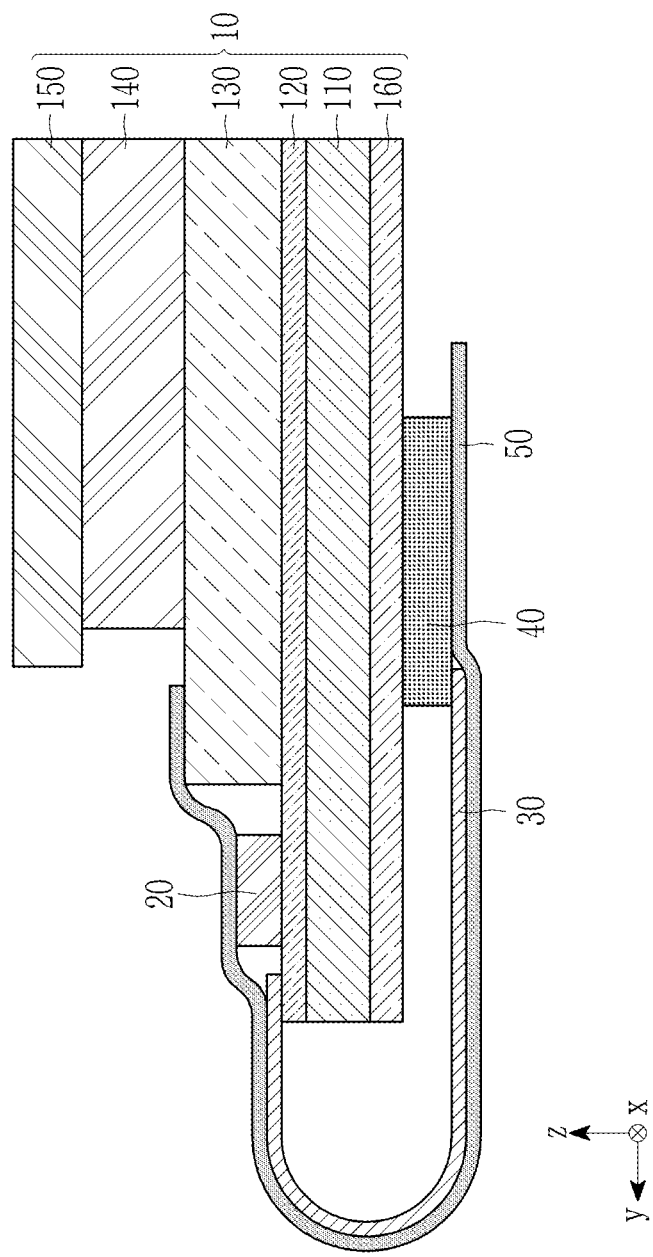
FIG. 9 illustrates a schematic cross-sectional view showing an upper portion in which a cover is positioned in a display device according to some embodiments.

FIG. 9 illustrates a schematic cross-sectional view showing an upper portion in which a cover is positioned in a display device according to an example.

Referring to FIG. 9, the driving integrated circuit chip 20 may be positioned on a front surface of the display panel 10. The first printed circuit board 30 may be bent while surrounding an edge of the display panel 10 in a state in which a first end is bonded to the pad portion positioned on the front surface of the display panel 10. The second printed circuit board 40 connected to the first printed circuit board 30 may be attached to the rear surface of the display panel 10 by an adhesive member such as an adhesive tape. Accordingly, the second printed circuit board 40 may be fixed to the display panel 10, and the first printed circuit board 30 may maintain a bent state. The cover 50 covering the driving integrated circuit chip 20, the first printed circuit board 30, and the second printed circuit board 40 is bent while surrounding an upper edge of the display panel 10, and thus it may be attached to the second printed circuit board 40 on the rear surface of the display panel 10. The cover 50 may include a portion positioned on an encapsulation layer 130.

Because the driving integrated circuit chip 20 protrudes from the substrate 110 of the display panel 10 in the third direction z on the front surface of the display panel 10, a portion of the cover 50 may be lifted. For example, the cover 50 may include a portion that is not attached anywhere on opposite sides of the driving integrated circuit chip 20, and an air pocket may be formed under the cover 50. When the air pocket is formed in this way, the cover 50 may lift or fall off. As described above, it is possible to prevent occurrence of defects in the cover 50 by forming the wing portions 50b and 50c aligned with the driving integrated circuit chip 20 on opposite sides of the cover 50 and providing an additional adhesion and tensile force by the wing portions 50b and 50c.

Referring to FIG. 9, when briefly describing the cross-sectional structure of the display panel 10, the display panel 10 may include a substrate 110, and a display layer 120, an encapsulation layer 130, an anti-reflection layer 140, and a cover window 150 that may be sequentially arranged on the substrate 110, and may include a cover panel 160 that may be positioned under the substrate 110.

The substrate 110 may be a rigid substrate including glass, quartz, ceramic, or the like. The substrate 110 may be a flexible substrate including a polymer layer made of, e.g., a polyimide, a polyamide, and polyethylene terephthalate.

The display layer 120 may include electrical elements for configuring pixels or driving pixels, e.g., transistors, capacitors, light emitting diodes, wires, and the like. The display layer 120 may include insulating layers to insulate or protect electrical elements. Referring to FIG. 1, the display layer 120 may include a display area DA and a non-display area NA. The first printed circuit board 30 may be electrically connected to the electrical elements of the display layer 120.

The encapsulation layer 130 may seal the display layer 120 to prevent penetration of moisture, oxygen, etc. into the display layer 120. The encapsulation layer 130 may be provided in the form of a substrate, and may be bonded to the substrate 110 by a sealant. The encapsulation layer 130 may be a thin film encapsulation layer formed on the display layer 120 and including at least one inorganic layer and at least one organic layer. For example, the thin film encapsulation layer may have a triple layer structure in which an organic layer is positioned between a first inorganic layer and a second inorganic layer.

The anti-reflection layer 140 may reduce light reflected by the display layer 120. The anti-reflection layer 140 may include a combination of a polarization layer and a phase delay layer. The anti-reflection layer 140 may include a combination of a light blocking member and color filters, or the anti-reflection layer 140 may include a combination of reflective layers causing destructive interference. A touch layer capable of sensing a user touch may be positioned between the encapsulation layer 130 and the anti-reflection layer 140.

The cover window 150 can transmit an image displayed by the display layer 120 and protect the display panel 10 from an external environment. The cover window 150 may be formed of a transparent material such as glass or plastic. The cover window 150 may be attached to the anti-reflection layer 140 by an adhesive member such as an optically transparent adhesive (OCA).

The cover panel 160 may be positioned on a back surface of the substrate 110. The cover panel 160 may include at least one of a cushion layer for absorbing external impact, a light absorbing layer for absorbing external light, a heat dissipation layer for dissipating heat, or a shielding layer for shielding electromagnetic waves.

Figure 10:
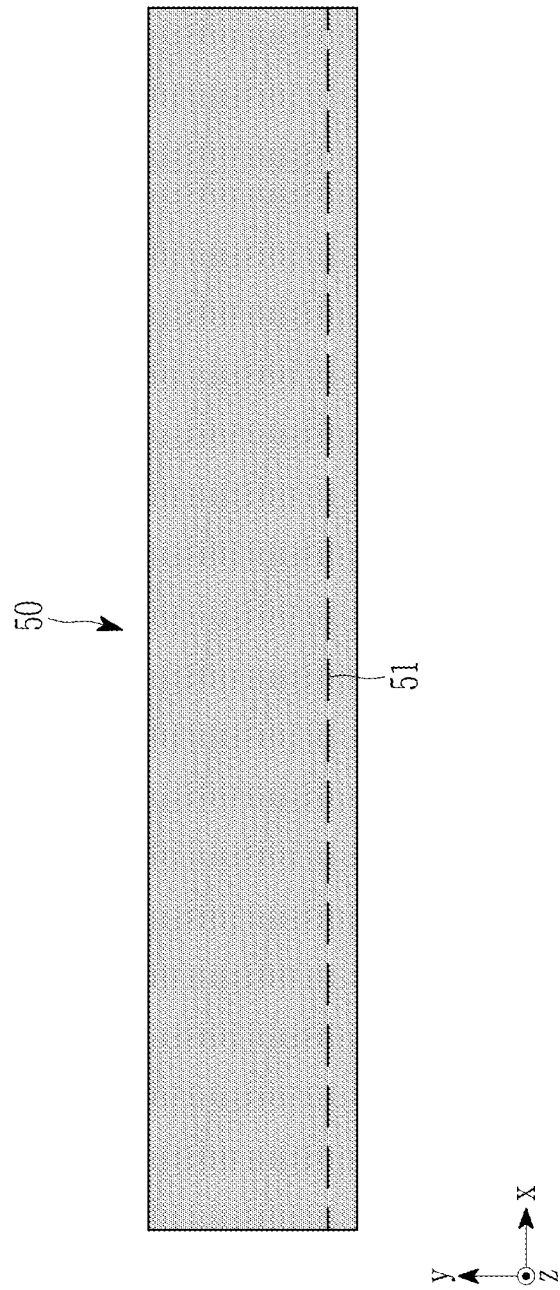
FIG. 10 illustrates a schematic view showing a cover according to some embodiments.
Figure 11:
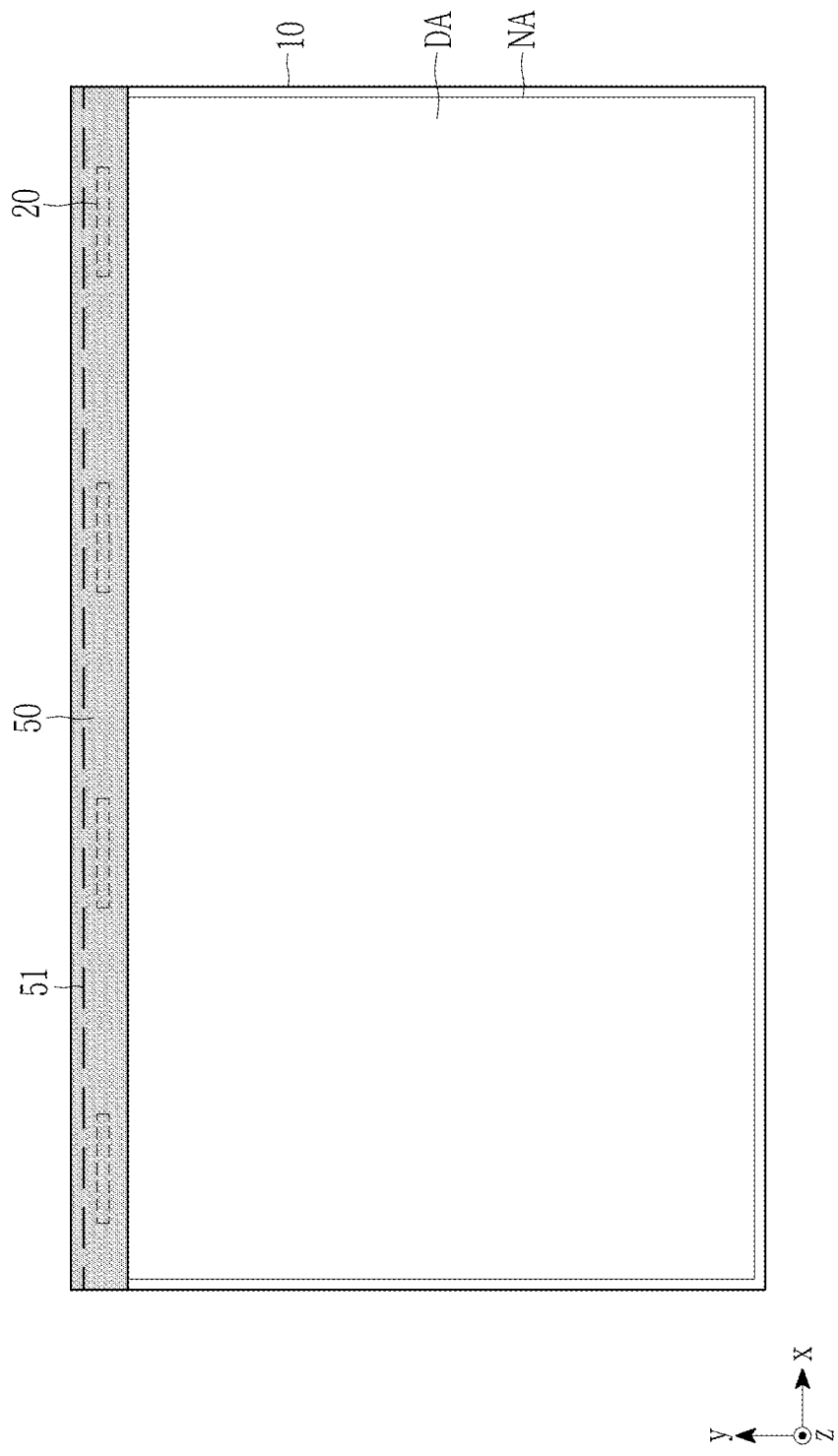
FIG. 11 illustrates a schematic front view showing a display device to which the cover illustrated in FIG. 10 is attached according to some embodiments.

FIG. 10 illustrates a schematic view showing a cover according to some embodiments, and FIG. 11 illustrates a schematic front view showing a display device to which the cover illustrated in FIG. 10 is attached.

Referring to FIG. 10 and FIG. 11, the cover 50 may include cuts 51 (or slits). The cuts 51 may be formed to be long at intervals in the first direction x like a dotted line. The cutouts 51 may be positioned between the driving integrated circuit chip 20 and an edge of the display panel 10 on the front surface of the display panel 10 in a state where the cover 50 is attached thereto. The cuts 51 may not be positioned in a bendable area of the cover 50. When the cuts 51 are formed as described above, the air in the air pocket formed between the cover 50 and the display panel 10 may escape through the cuts 51 due to protrusion of the driving integrated circuit chip 20. Accordingly, a size of the air pocket may be reduced, the attachment area of the cover 50 may be increased, and lifting of the cover 50 may be reduced or prevented. The cuts 51 are not provided in the bendable area, and thus when the cover 50 is bent, the cover 50 may not be broken, torn, or damaged due to the cuts 51.

Figure 12:
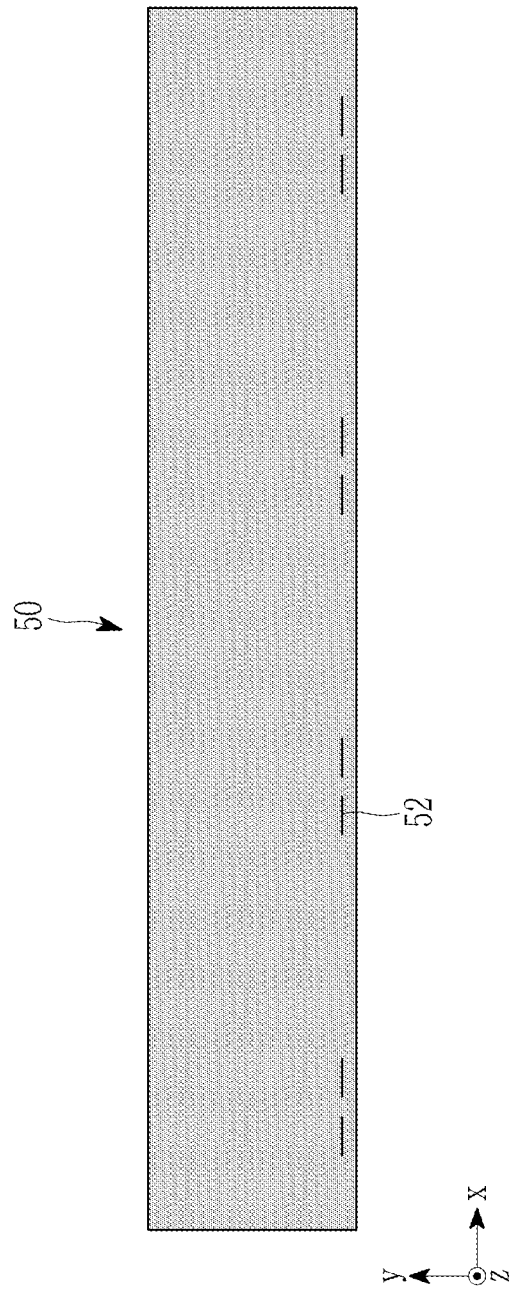
FIG. 12 illustrates a schematic view showing a cover according to some embodiments.
Figure 13:
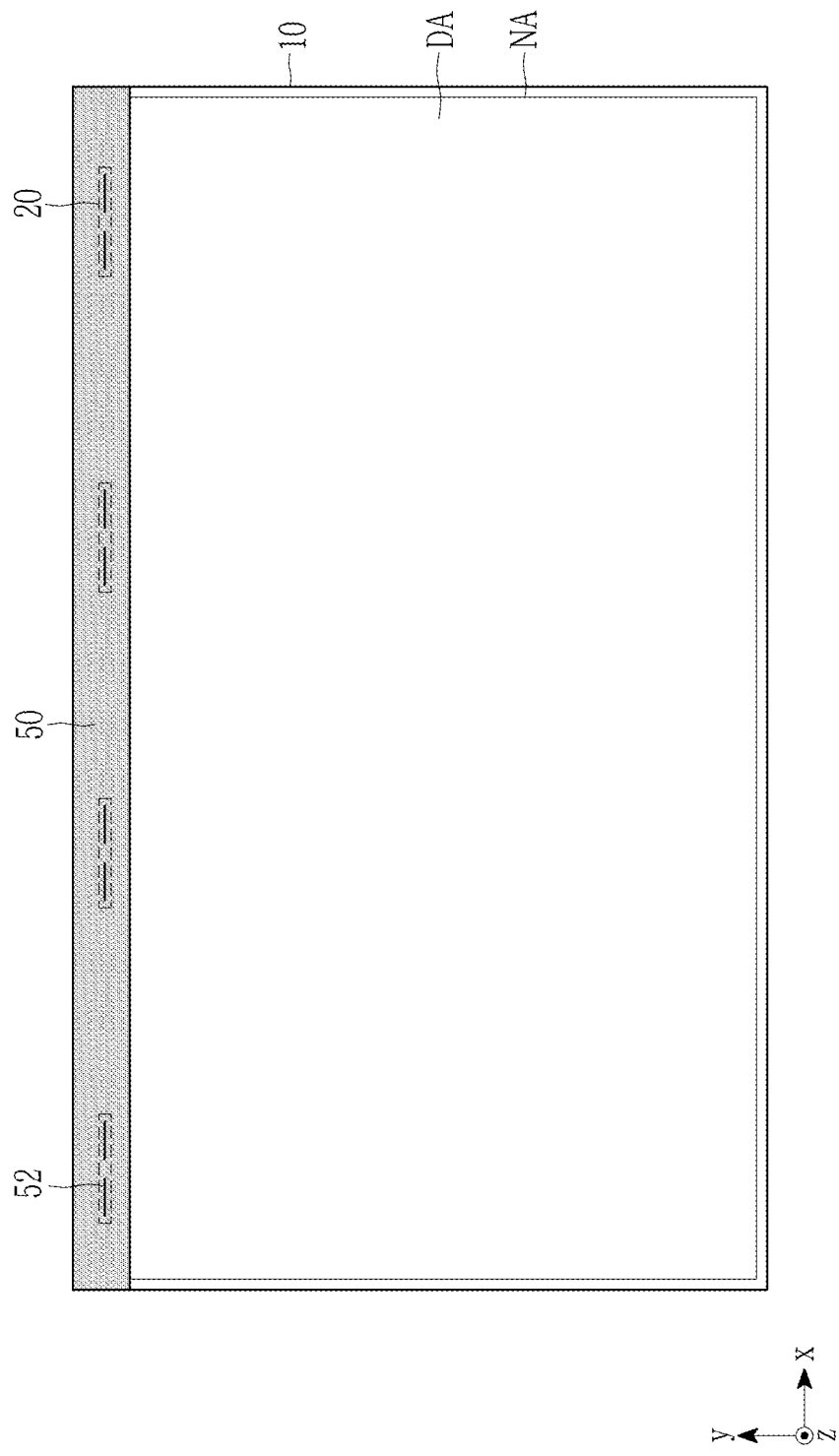
FIG. 13 illustrates a schematic front view showing a display device to which the cover illustrated in FIG. 12 is attached according to some embodiments.
Figure 14:
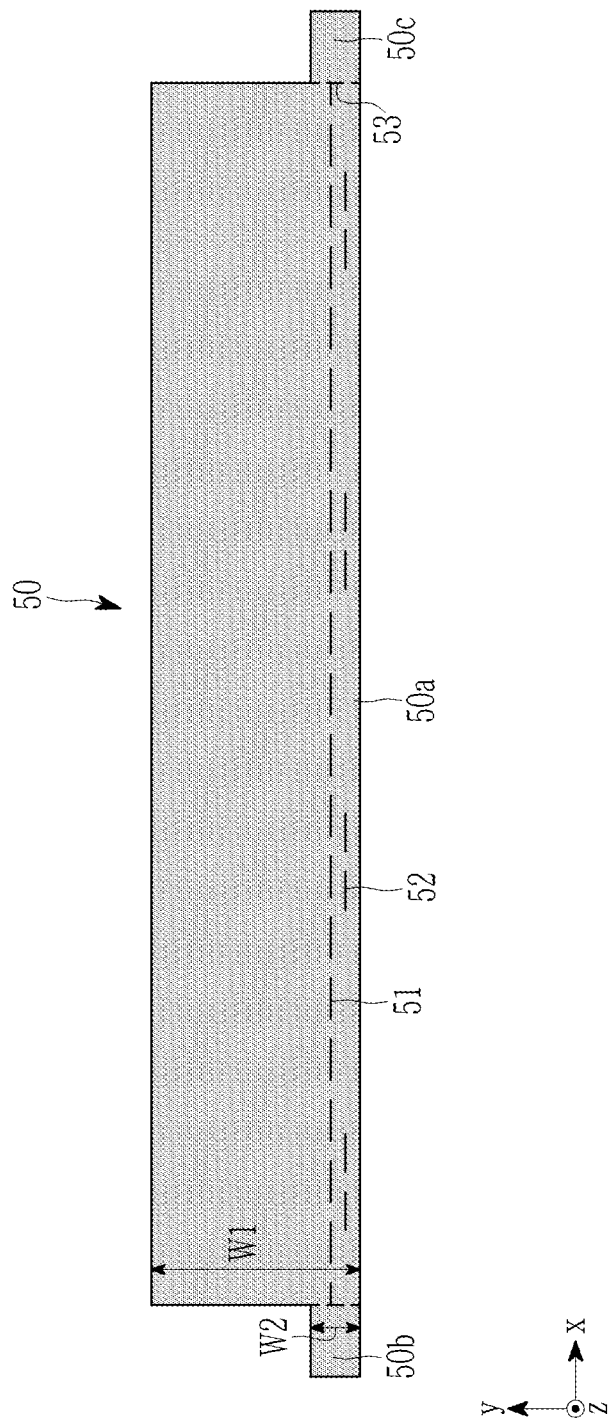
FIG. 14 illustrates a schematic view showing a cover according to some embodiments.

FIG. 12 illustrates a schematic view showing a cover according to some embodiments, and FIG. 13 illustrates a schematic front view showing a display device to which the cover illustrated in FIG. 10 is attached.

Referring to FIG. 12 and FIG. 13, the cover 50 may include cuts 52 (or slits). The cuts 52 may be formed to be long at intervals in the first direction x. The cuts 52 may be formed at positions overlapping the driving integrated circuit chip 20 on the front surface of the display panel 10. As in the above-described embodiments, by the cuts 52, the attachment area of the cover 50 may be increased, and lifting of the cover 50 may be reduced or prevented.

FIG. 13 illustrates a schematic view showing a cover according to some embodiments.

The cover 50 illustrated in FIG. 13 may include a body portion 50a and wing portions 50b and 50c similar to the cover 50 illustrated in FIG. 4. The cuts 51 formed in the cover 50 illustrated in FIG. 10 and/or the cuts 52 formed in the cover 50 illustrated in FIG. 12 may be formed in the body portion 50a. Cuts 53 may also be formed between the body portion 50a and the wing portions 50b and 50c. By a combination of the wing portions 50b and 50c and the cuts 51, 52, and 53, it is possible to further increase the adhesive force of the cover 50, and it is possible to reduce or prevent the lifting of the cover 50.

While this disclosure has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims, and their equivalents.

What is claimed is:

1. A display device comprising:
a display panel;
a driving integrated circuit chip configured to drive the display panel;
a first printed circuit board connected to the display panel;
a second printed circuit board connected to the first printed circuit board; and
a cover including a body portion covering the driving integrated circuit chip, the first printed circuit board, and the second printed circuit board, and a wing portion protruding from the body portion,
wherein the wing portion extends from a front surface of the display panel to a rear surface of the display panel while surrounding a side surface of the display panel;
wherein the body portion and the wing portion each have a length in a frist direction and a width in a second direction intersecting the first direction, and the length and the width of the wing portion are smaller than the length and the width of the body portion, respectively.

2. The display device of claim 1, wherein
the body portion covers the driving integrated circuit chip on a front surface of the display panel and covers the second printed circuit board on a rear surface of the display panel, and
the wing portion is attached to the body portion on the rear surface.

3. The display device of claim 1, wherein
the body portion and the wing portion are integrally formed.

4. The display device of claim 1, wherein
the wing portion includes a first wing portion at a first end of the body portion and a second wing portion at a second end of the body portion, and
the first wing portion and the second wing portion are on a same line as the driving integrated circuit chip in a first direction.

5. The display device of claim 1, wherein
the driving integrated circuit chip is on a front surface of the display panel,
the second printed circuit board is on a rear surface of the display panel, and
the first printed circuit board is bent while surrounding an edge of the display panel.

6. The display device of claim 5, wherein
the body portion covers the driving integrated circuit chip on the front surface of the display panel, covers the second printed circuit board on the rear surface of the display panel, and covers the first printed circuit board over the front surface, the side surface, and the rear surface of the display panel.

7. The display device of claim 1, wherein
the cover includes cuts between the driving integrated circuit chip and an edge of the display panel on the front surface of the display panel.

8. The display device of claim 1, wherein
the cover includes a cut overlapping the driving integrated circuit chip on the front surface of the display panel.

9. The display device of claim 1, wherein
the cover includes a cut between the body portion and the wing portion.

10. A display device comprising:
a display panel;
a driving integrated circuit chip on a front surface of the display panel;
a first printed circuit board connected to the front surface of the display panel and bent while surrounding an edge of the display panel;
a second printed circuit board connected to the first printed circuit board and on a rear surface of the display panel; and
a cover covering the driving integrated circuit chip, the first printed circuit board, and the second printed circuit board,
wherein the cover includes a body portion and a wing portion protruding from the body portion and having a width that is narrower than that of the body portion, wherein the wing portion is attached to the body portion on a rear surface of the display panel;

wherein the body portion and the wing portion each have a length in a first direction and a width in a second direction intersecting the first direction, and the length and the width of the wing portion are smaller than the length and the width of the body portion, respectively.

11. The display device of claim 10, wherein
the first printed circuit board surrounds an edge of the display panel that is parallel to a first direction, and the wing portion surrounds an edge of the display panel that is parallel to a second direction intersecting the first direction.

12. The display device of claim 10, wherein
the cover is a tape including a metal layer.

13. The display device of claim 10, wherein
the wing portion includes a first wing portion at a first end of the body portion and a second wing portion at a second end of the body portion, and
the first wing portion and the second wing portion are on a same line as the driving integrated circuit chip in a first direction.

14. The display device of claim 10, wherein
the body portion is bent while surrounding the edge of the display panel.

15. The display device of claim 14, wherein
the body portion covers the driving integrated circuit chip on the front surface of the display panel, covers the second printed circuit board on the rear surface of the display panel, and covers the first printed circuit board over the front surface, a side surface, and the rear surface of the display panel.

16. The display device of claim 10, wherein
the cover includes cuts between the driving integrated circuit chip and an edge of the display panel on the front surface of the display panel.

17. The display device of claim 10, wherein
the cover includes a cut overlapping the driving integrated circuit chip on the front surface of the display panel.

18. The display device of claim 10, wherein
the cover includes a cut between the body portion and the wing portion.

* * * * *